(12) United States Patent
Feng et al.

(10) Patent No.: US 12,464,824 B2
(45) Date of Patent: Nov. 4, 2025

(54) ARRAY SUBSTRATE, MANUFACTURING METHOD THEREOF, AND DISPLAY PANEL THEREOF

(71) Applicant: GUANGZHOU CHINA STAR OPTOELECTRONICS SEMICONDUCTOR DISPLAY TECHNOLOGY CO., LTD., Guangdong (CN)

(72) Inventors: Leilei Feng, Guangdong (CN); Shan Li, Guangdong (CN)

(73) Assignee: GUANGZHOU CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/755,528

(22) PCT Filed: Apr. 15, 2022

(86) PCT No.: PCT/CN2022/087100
§ 371 (c)(1),
(2) Date: Apr. 29, 2022

(87) PCT Pub. No.: WO2023/184600
PCT Pub. Date: Oct. 5, 2023

(65) Prior Publication Data
US 2024/0170492 A1  May 23, 2024

(30) Foreign Application Priority Data
Mar. 30, 2022 (CN) .......................... 202210328409.0

(51) Int. Cl.
*H01L 27/12* (2006.01)
*H10D 86/01* (2025.01)
(Continued)

(52) U.S. Cl.
CPC ......... *H10D 86/60* (2025.01); *H10D 86/0221* (2025.01); *H10D 86/0241* (2025.01); *H10D 86/421* (2025.01)

(58) Field of Classification Search
CPC ............... H01L 27/1222; H01L 27/127; H01L 27/1292; H01L 27/1225; H01L 29/7869;
(Continued)

(56) References Cited

U.S. PATENT DOCUMENTS

2010/0176388 A1   7/2010  Ha et al.
2011/0039362 A1*  2/2011  Long ............... H01L 27/1285
                                          257/E21.414

(Continued)

FOREIGN PATENT DOCUMENTS

CN   101794819 A   8/2010
CN   102543754 A   7/2012
(Continued)

OTHER PUBLICATIONS

International Search Report in International application No. PCT/CN2022/087100, mailed on Oct. 27, 2022.
(Continued)

*Primary Examiner* — Mohammed R Alam
(74) *Attorney, Agent, or Firm* — PV IP PC; Wei Te Chung (57) ABSTRACT

The present application provides an array substrate, a manufacturing method thereof, and a display panel thereof. A first ink is coated on an active region of an underlay substrate to form an active layer pattern, a second ink is coated on a channel region on the underlay substrate to form a protective layer pattern. Then the active layer pattern and the protective layer pattern is cured to form films, and to simultaneously form an active layer and a protective layer. The protective layer can protect the channel region of the active layer to mitigate an issue of the conventional corroded and contaminated metal oxide.

7 Claims, 5 Drawing Sheets

(51) Int. Cl.
*H10D 86/40* (2025.01)
*H10D 86/60* (2025.01)

(58) Field of Classification Search
CPC ............. H01L 29/78606; H10D 86/60; H10D 86/0221; H10D 86/0241; H10D 86/421; H10D 30/6755; H10D 86/423; H10D 30/6704
See application file for complete search history.

(56) References Cited

U.S. PATENT DOCUMENTS

| | | | | |
|---|---|---|---|---|
| 2019/0067452 | A1* | 2/2019 | Cheng | ............... B82Y 10/00 |
| 2019/0285953 | A1* | 9/2019 | Kao | ............... G02F 1/136222 |
| 2021/0408269 | A1* | 12/2021 | Xie | ............... H01L 21/823807 |

FOREIGN PATENT DOCUMENTS

| | | | |
|---|---|---|---|
| CN | 103236443 | A | 8/2013 |
| CN | 104934330 | A | 9/2015 |
| CN | 105914150 | A | 8/2016 |
| CN | 110572939 | A | 12/2019 |
| JP | 2008300480 | A | 12/2008 |
| KR | 20100063598 | A | 6/2010 |
| WO | 2019204977 | A1 | 10/2019 |

OTHER PUBLICATIONS

Written Opinion of the International Searching Authority in International application No. PCT/CN2022/087100, mailed on Oct. 27, 2022.

Chinese Office Action issued in corresponding Chinese Patent Application No. 202210328409.0 dated Aug. 14, 2025, pp. 1-7.

* cited by examiner

ARRAY SUBSTRATE, MANUFACTURING METHOD THEREOF, AND DISPLAY PANEL THEREOF

FIELD OF INVENTION

The present application relates to a field of display technologies, especially to an array substrate, a manufacturing method thereof, and a display panel thereof.

BACKGROUND OF INVENTION

In the conventional display technologies, a thin film transistor (TFT) device is mainly used to control a pixel switch to form required display images. Semiconductor materials used for thin film transistor device mainly comprises amorphous silicon, metal oxide, and low-temperature polycrystalline silicon. The metal oxide has a higher electron mobility compared to amorphous silicon, and has a simpler manufacturing process compared to low-temperature polycrystalline silicon while satisfying requirements of high resolutions and high refresh frequencies. Although the metal oxide semiconductor material has many advantages, it lacks stability. For example, after processes of the metal oxide semiconductor are completed and source and drain electrode metal wirings are formed thereon, the metal oxide semiconductor is easily corroded and contaminated to result in abnormal characteristics of the semiconductor.

SUMMARY OF INVENTION

Technical Issue

The present application provides an array substrate, a manufacturing method thereof, and a display panel thereof to mitigate a technical issue of the corroded and contaminated metal oxide.

Technical Solution

To solve the above issue, the present application provides technical solutions as follows:

An embodiment of the present application provides an array substrate manufacturing method, comprising:
providing an underlay substrate, and defining active region and a channel region on the underlay substrate, wherein the channel region is located in the active region;
coating a first ink on the active region to form an active layer pattern;
coating a second ink on the channel region to form a protective layer pattern; and
curing the active layer pattern and the protective layer pattern such that the active layer pattern forms an active layer and the protective layer pattern forms a protective layer.

In the array substrate manufacturing method provided by the embodiment of the present application, the step of coating a first ink on the active region to form an active layer pattern, comprises:
manufacturing a metal salt solution to form the first ink; and
by ink-jet printing process, printing the first ink on the active region to form the active layer pattern.

In the array substrate manufacturing method provided by the embodiment of the present application, the metal salt solution comprises at least one of a $Zn(NO_3)_2$ solution or an $In(NO_3)_3$ solution.

In the array substrate manufacturing method provided by the embodiment of the present application, the step of coating a second ink on the channel region to form a protective layer pattern, comprises:
dissolving $SiS_2$ powders in an organic solvent to form the second ink; and
by an ink-jet printing process, printing the second ink on the channel region to form the protective layer pattern.

In the array substrate manufacturing method provided by the embodiment of the present application, the organic solvent comprises benzene and alcohols.

In the array substrate manufacturing method provided by the embodiment of the present application, the step of curing the active layer pattern and the protective layer pattern such that the active layer pattern forms an active layer and the protective layer pattern forms a protective layer, comprises:
sending the underlay substrate formed with the active layer pattern and the protective layer pattern into a drying oven and drying the underlay substrate, and simultaneously extracting gas in the drying oven such that a solvent in the metal salt solution is volatilized to form a metal oxide semiconductor layer as the active layer, and in the meantime, the $SiS_2$ powders in the second ink reacts with moisture in the metal salt solution to form $SiO_2$ to form the protective layer on a surface of the active layer.

In the array substrate manufacturing method provided by the embodiment of the present application, before the step of coating a first ink on the active region to form an active layer pattern, the method further comprises:
forming a first metal thin film on the underlay substrate and patterning the first metal thin film to form a gate electrode correspondingly in the active region; and
manufacturing a gate electrode insulation layer on the gate electrode and the underlay substrate.

In the array substrate manufacturing method provided by the embodiment of the present application, further comprises steps as follows:
forming a second metal thin film on the protective layer and the underlay substrate, and patterning the second metal thin film to form a source electrode and a drain electrode, wherein the source electrode and the drain electrode are connected to the active layer on two sides of the protective layer respectively;
forming a gate electrode insulation layer on the source electrode, the drain electrode, and the protective layer; and
forming a gate electrode on the gate electrode insulation layer, wherein the gate electrode is disposed to correspond to the protective layer.

The embodiment of the present application also provides an array substrate comprising an array substrate manufactured by the array substrate manufacturing method of one of aforementioned embodiments.

The embodiment of the present application further provides a display panel comprising an opposite substrate and the array substrate of the aforementioned embodiment, the array substrate and the opposite substrate are disposed oppositely at an interval.

Advantages

The array substrate, the manufacturing method thereof, and the display panel thereof provided by the present application coat a first ink on an active region of an underlay substrate to form an active layer pattern, coating a second ink on a location of the active layer pattern corresponding to the channel region to form a protective layer pattern, curing the active layer pattern and the protective layer pattern to form films to make the active layer pattern form an active layer and make the protective layer pattern form protective layer such that the protective layer is disposed on the channel region of the active layer to protect the channel region of the active layer, which prevents the channel region of the active layer from corrosion and contamination to solve the corrosion and contamination of the conventional metal oxide. Also, the active layer and the protective layer are formed simultaneously to save one mask, which lowers the cost.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

DETAILED DESCRIPTION OF PREFERRED EMBODIMENTS

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference characters. In the accompanying drawings, for clear understanding and convenient descriptions, some thicknesses of layers and regions are exaggerated. Namely, a size and a size of each assembly in the accompanying drawings are illustrated arbitrarily, but the present application is not limited thereto.

Figure 1:
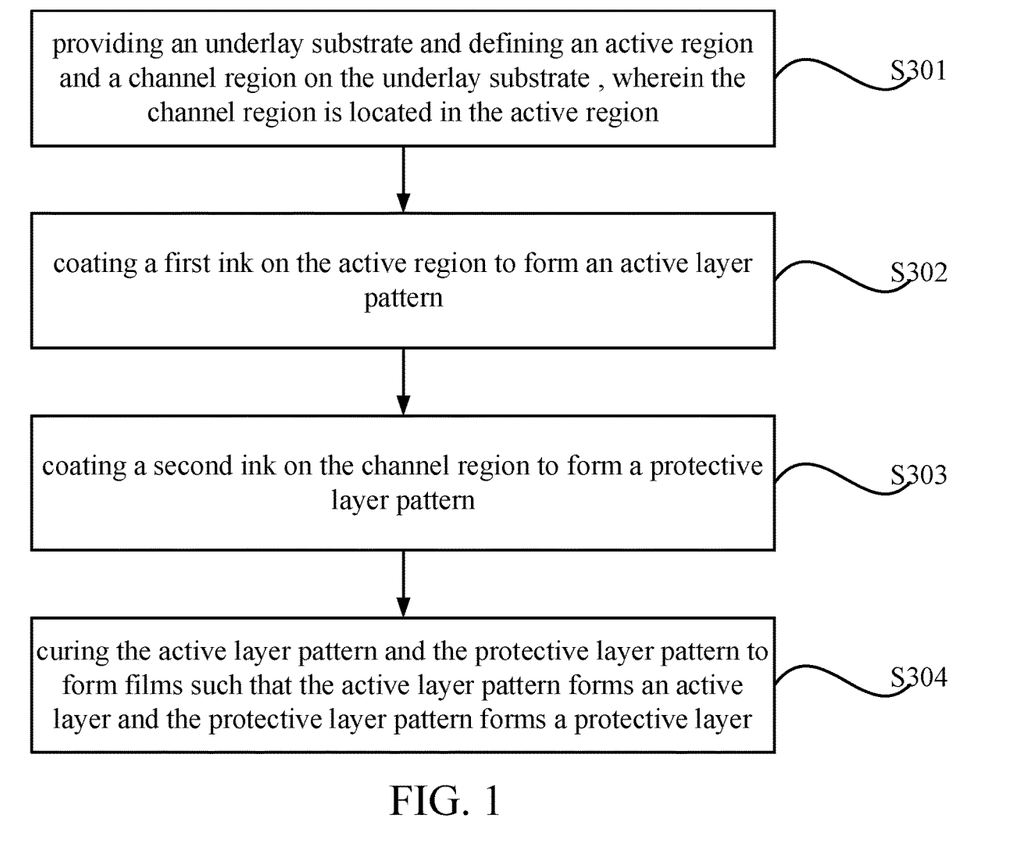
FIG. 1 is a schematic flowchart of an array substrate manufacturing method provided by an embodiment of the present application.
Figure 2:
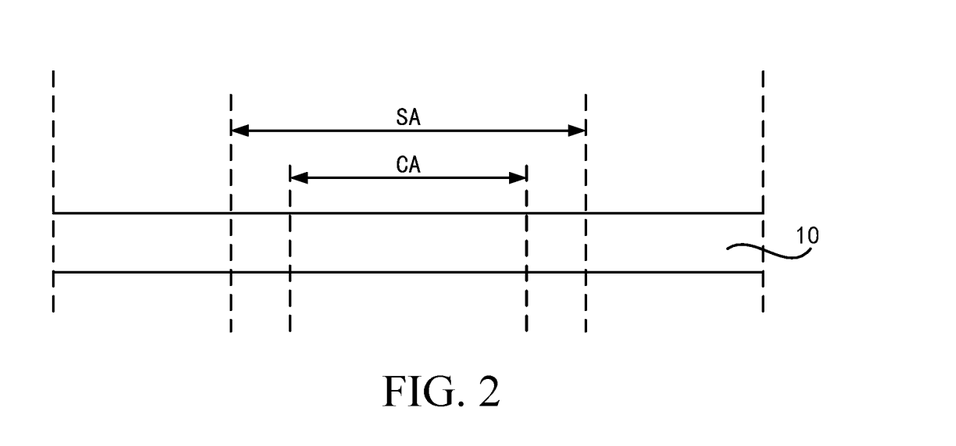
FIG. 2 is a schematic cross-sectional structural view of an underlay substrate provided by the embodiment of the present application.
Figure 3:
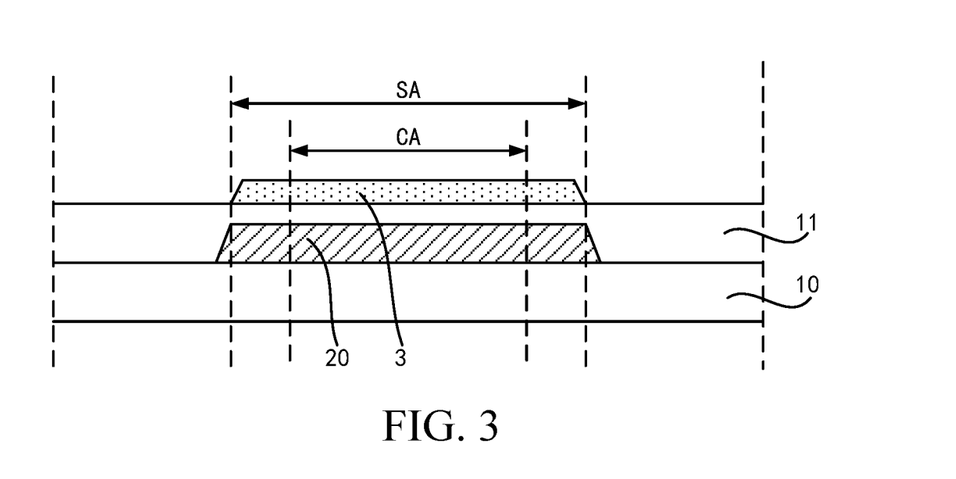
FIG. 3 is a schematic cross-sectional structural view of a gate electrode and active layer pattern manufactured on the underlay substrate in FIG. 2.
Figure 4:
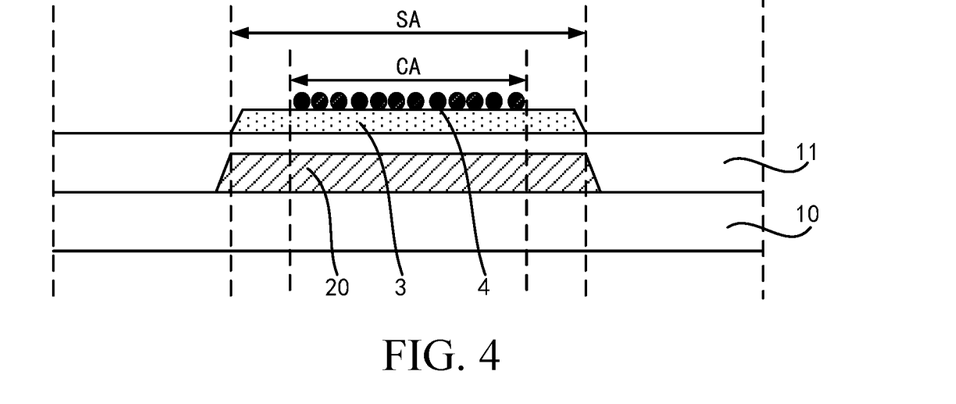
FIG. 4 is a schematic cross-sectional structural view of a protective layer pattern manufactured on the active layer pattern in FIG. 3.
Figure 5:
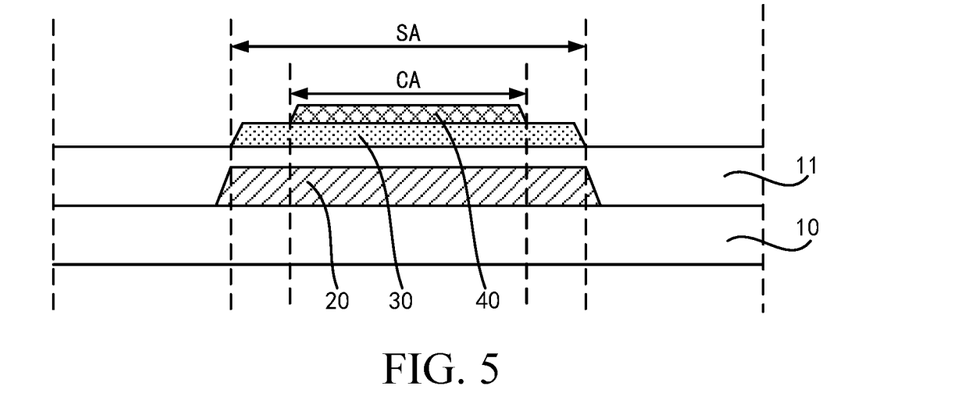
FIG. 5 is a schematic cross-sectional structural view of an active layer and a protective layer formed by curing the active layer pattern and the protective layer pattern in FIG. 4.
Figure 6:
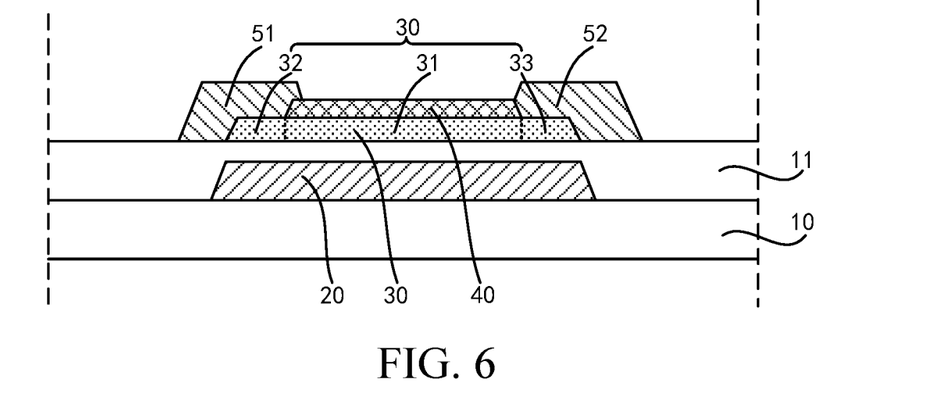
FIG. 6 is a schematic cross-sectional structural view of a source electrode and a drain electrode manufactured on the active layer and the protective layer in FIG. 5.
Figure 7:
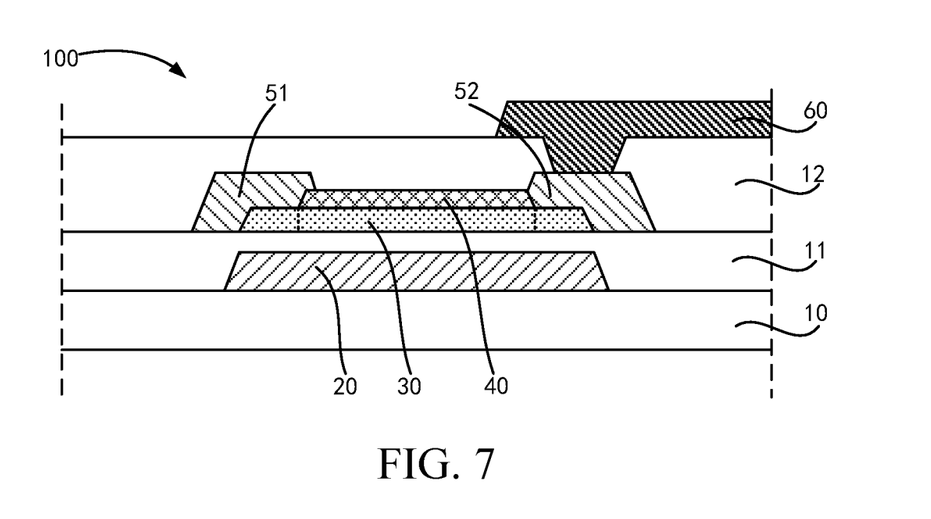
FIG. 7 is a schematic cross-sectional structural view of a pixel electrode manufactured on the drain electrode in FIG. 6.

With reference to FIGS. 1 to 7, FIG. 1 is a schematic flowchart of an array substrate manufacturing method provided by an embodiment of the present application, FIGS. 2 to 7 are schematic structural views of a partial film layer of the array substrate manufactured by each step of the array substrate manufacturing method provided by the embodiment of the present application, wherein FIG. 2 is a schematic cross-sectional structural view of an underlay substrate provided by the embodiment of the present application; FIG. 3 is a schematic cross-sectional structural view of a gate electrode and active layer pattern manufactured on the underlay substrate in FIG. 2; FIG. 4 is a schematic cross-sectional structural view of a protective layer pattern manufactured on the active layer pattern in FIG. 3; FIG. 5 is a schematic cross-sectional structural view of an active layer and a protective layer formed by curing the active layer pattern and the protective layer pattern in FIG. 4; FIG. 6 is a schematic cross-sectional structural view of a source electrode and a drain electrode manufactured on the active layer and the protective layer in FIG. 5; FIG. 7 is a schematic cross-sectional structural view of a pixel electrode manufactured on the drain electrode in FIG. 6.

In particular, the array substrate manufacturing method comprises steps as follows:

A step S301 comprises: providing an underlay substrate 10 and defining an active region CA and a channel region SA on the underlay substrate 10, wherein the channel region SA is located in the active region CA.

In particular, with reference to FIG. 2, an active region CA and a channel region SA are defined on the underlay substrate 10, the active region CA is configured to dispose an active layer 30, the channel region SA corresponds to a channel 31 of the active layer 30, and the channel region SA is located in the active region CA. In particular, the channel region SA is located in a middle region of the active region CA.

Optionally, the underlay substrate 10 can be a rigid substrate or a flexible substrate. When the underlay substrate 10 is a rigid substrate, it can comprise a hard substrate such as a glass substrate. When the underlay substrate 10 is a flexible substrate, it can comprise a flexible substrate such as polyimide (PI) thin film and ultra-thin glass thin film. The embodiment of the present application uses the underlay substrate 10 being a glass substrate as an example for explanation.

A step S302 comprises: coating a first ink on the active region CA to form an active layer pattern 3.

In particular, the before the step of printing a first ink on the active region CA to form an active layer pattern 3, the method further comprises steps as follows:

with reference to FIG. 3, forming a first metal thin film on the underlay substrate 10, patterning the first metal thin film to form a gate electrode 20 correspondingly in the active region CA; and manufacturing a gate electrode insulation layer 11 on the gate electrode 20 and the underlay substrate 10.

In particular, before the first metal thin film is formed on the underlay substrate 10, pre-processes such as cleaning and baking is implemented to the underlay substrate 10 in advance. Then, a depositing process such as a sputtering deposition process or a physical vapor deposition (PVD) process is implemented to deposit the first metal thin film on the underlay substrate 10. Then, a yellow light process is implemented to the first metal thin film to form the gate electrode 20 at a corresponding location of the active region CA. Optionally, a material of the first metal thin film comprises at least one of molybdenum (Mo), aluminum (Al), or copper (Cu).

Of course, when the underlay substrate 10 is a flexible substrate such as a polyimide thin film, before the first metal thin film is deposited, an inorganic film layer can be deposited on the underlay substrate 10 as a buffer layer. Optionally, the inorganic film layer comprises a silicon nitride (SiNx) layer, a silicon oxide (SiOx) layer, or a lamination complex film of the silicon nitride (SiNx) layer and the silicon oxide (SiOx) layer. The buffer layer can prevent unexpected impurities or contaminants from spreading from the underlay substrate 10 to a device that may be damaged due to these impurities or contaminants, and can also provide a flat top surface.

Furthermore, one or more inorganic film layers are deposited on the gate electrode 20 and the underlay substrate 10 as a gate electrode insulation layer 11. Optionally, the inorganic film layer comprises a silicon oxide (SiOx) layer, or a lamination complex film of the silicon nitride (SiNx) layer and the silicon oxide (SiOx) layer.

Furthermore, an ink-jet printing (IJP) process is used to print a first ink on the active region CA to form an active layer pattern 3. In particular, a metal salt solution is manufactured to form the first ink, the metal salt solution comprises at least one of a $Zn(NO_3)_2$ solution or a $In(NO_3)_3$ solution, namely, at least one metal salt solution in the $Zn(NO_3)_2$ solution and the $In(NO_3)_3$ solution is mixed to form the first ink.

Selections for a specific metal salt solution can be determined according to a metal oxide semiconductor material to be selected. For example, a metal oxide semiconductor material is ZnO, then a $Zn(NO_3)_2$ solution can be selected. For example, the metal oxide semiconductor material to be selected is InO, then a $In(NO_3)_3$ solution can be selected. Optionally, the metal oxide semiconductor material can also be IGZO, YZO, ITZO, etc. Furthermore, a dispensing concentration of the first ink can be adjusted according to characteristics of the film layer thickness and the semiconductor to be achieved.

Then an ink-jet printing process is used to print the first ink at a location of the gate electrode insulation layer 11 corresponding to the active region CA to form the active layer pattern 3. A location and a size of the active layer pattern 3 can be achieved by controlling a concentration of the first ink and an ink-jet printing speed.

A step S303 comprises: coating a second ink on the channel region SA to form a protective layer pattern 4.

In particular, the $SiS_2$ powders are dissolved in an organic solvent to form the second ink. The organic solvent comprises volatile organic solvent such as benzene and alcohols. In particular, nano-scale $SiS_2$ powders are dissolved in the volatile organic solvent such as benzene and alcohols to form a uniform suspension as the second ink. Then, an ink-jet printing process is used to print the second ink on a location of the active layer pattern 3 corresponding to the channel region SA to form the protective layer pattern 4, as shown in FIG. 4. Similarly, a location and a size of the protective layer pattern 4 can also be achieved by controlling a concentration of the second ink and an ink-jet printing speed.

It should be explained that smaller particles of the $SiS_2$ powders for forming the second ink are better. $SiS_2$ in the suspension formed by the $SiS_2$ powders with smaller particles dissolved in the organic solvent are distributed more evenly. Therefore, the embodiment of the present application selects nano-scale $SiS_2$ powders. Furthermore, a substance of the present application for forming the second ink is not limited to $SiS_2$ powders, in particular, different substances can be chosen according to a material for forming the protective layer 40.

A step S304 comprises: curing the active layer pattern 3 and the protective layer pattern 4 to form films such that the active layer pattern 3 forms an active layer 30 and the protective layer pattern 4 forms a protective layer 40.

In particular, the underlay substrate 10 formed with the active layer pattern 3 and the protective layer pattern 4 is sent into a drying oven and dried, and simultaneously gas is extracted such that the solvent in the metal salt solution is evaporated to form a metal oxide semiconductor layer as the active layer 30. In the meantime, $SiS_2$ in the second ink reacts with moisture in the solution to form $SiO_2$ (of course, if necessary, moisture can be injected during the curing process to ensure a film forming reaction of $SiO_2$ is complete) to form the protective layer 40 on a surface of the active layer 30, as shown in FIG. 5.

Optionally, the method for curing the active layer pattern 3 and the protective layer pattern 4 to form films is not limited to drying in the drying oven, but also can use other heating method for curing and film-forming. The metal salt solution in the first ink forming the active layer pattern 3, under a heating condition, is decomposed to form metal oxide, for example, the first ink formed by $Zn(NO_3)_2$ solution, under a heating condition would be decomposed into ZnO. Water in the active layer pattern 3 would be evaporated under a heating condition, and finally form the active layer 30 formed by the metal oxide.

Also, under a heating condition, volatile organic solvent such as benzene and alcohols in the second ink forming the protective layer pattern 4 would be evaporated, $SiS_2$ in the second ink would react with water from the evaporated first ink to form $SiO_2$ (of course, if necessary, moisture can be injected during the curing process to ensure a film forming reaction of $SiO_2$ is complete), and to finally form the protective layer 40 formed by $SiO_2$. A part of the active layer 30 covered by the protective layer 40 is the channel 31 of the active layer 30, namely, the part of the active layer 30 corresponding to the channel region SA is the channel 31 of the active layer 30. The parts of the active layer 30 located on two sides of the channel 31 not covered by the protective layer 40 are the source electrode region 32 and the drain electrode region 33 of the active layer 30.

By forming the protective layer 40 on the channel 31 of the active layer 30, the protective layer 40 can protect the channel 31 to prevent later processes from corroding, contaminating, and damaging the channel 31. Also, the active layer 30 and the protective layer 40 of the present application are form synchronously. Compared to an individual mask used for forming a protective layer 40 on the active layer 30, the manufacturing method of the present application can save a mask to further simplify process steps and lower the cost.

Furthermore, the array substrate manufacturing method of the present embodiment, after forming the active layer 30 and the protective layer 40, further comprises a step as follows:

forming a second metal thin film on the protective layer 40 and the gate electrode insulation layer 11 and patterning the second metal thin film to form a source electrode 51 and a drain electrode 52, wherein the source electrode 51 and the drain electrode 52 are connected to the active layer 30 on two sides of the protective layer 40 respectively.

In particular, a depositing process such as a sputtering deposition process or a physical vapor deposition process is also used to deposit a second metal thin film on the protective layer 40 and the gate electrode insulation layer 11, then a yellow light process is performed to the second metal thin film to form the source electrode 51 on the corresponding source electrode region 32 of the active layer 30 and form the drain electrode 52 on the corresponding drain electrode region 33 of the active layer 30. With reference to FIG. 6, the source electrode 51 is connected to the source electrode region 32, and, the drain electrode 52 is connected to the drain electrode region 33. Optionally, a material of the second metal thin film comprises at least one of molybdenum (Mo), aluminum (Al), or copper (Cu).

It can be understood that before the second metal thin film is formed, the active layer 30 needs to be conductorized such that the source electrode region 32 和 the drain electrode region 33 of the active layer 30 are conductorized. Because the channel 31 is covered by the protective layer 40, the protective layer 40 can protect the channel 31 to prevent the channel 31 from damages during conductorizing. When a yellow light process is performed to the second metal thin film to form the source electrode 51 and the drain electrode 52, the protective layer 40 can also protect the channel 31 and prevent etching agent from corroding and contaminating the channel 31. Furthermore, while the second metal thin film forms the source electrode 51 and the drain electrode 52, other signal lines such as data lines can be formed.

A passivation layer 12 is formed on the source electrode 51, the drain electrode 52, the protective layer 40, and the gate electrode insulation layer 11, and a pixel electrode 60 is formed on the passivation layer 12.

In particular, with reference to FIG. 7, one or more inorganic film layers are formed on the source electrode 51, the drain electrode 52, the protective layer 40 and the gate electrode insulation layer 11 as the passivation layer 12 to protect the source electrode 51 and the drain electrode 52. Optionally, the inorganic film layer comprises a silicon nitride (SiNx) layer, a silicon oxide (SiOx) layer, or a lamination complex film of the silicon nitride (SiNx) layer and the silicon oxide (SiOx) layer. Of course, to provide the array substrate 100 with a flat top surface, a planarization layer can also be formed on the passivation layer 12, and the planarization layer can used a material such as organic photoresist.

Furthermore, a transparent conductive thin film is deposited on the passivation layer 12, the transparent conductive thin film is patterned to form the pixel electrode 60, to form the array substrate 100. The pixel electrode 60, through a via hole of the passivation layer 12, is connected to the source electrode 51 or the drain electrode 52. The embodiment of the present application uses the pixel electrode 60 connected to the drain electrode 52 as an example for explanation. Optionally, the transparent conductive thin film comprises a thin film formed by a transparent conductive material such as ITO, IZO, ZnO, or $In_2O_3$.

Figure 8:
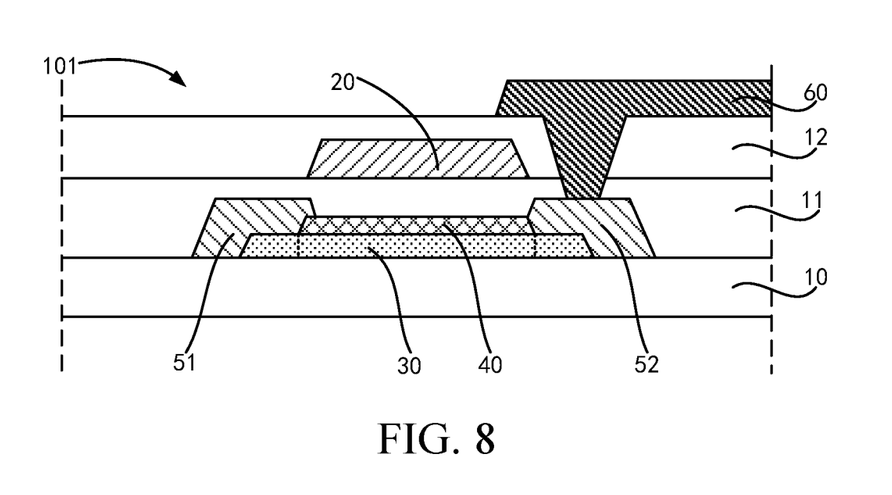
FIG. 8 is another schematic cross-sectional structural view of the array substrate provided by the embodiment of the present application.

In an embodiment, with reference to FIGS. 1 to 8, FIG. 8 is another schematic cross-sectional structural view of the array substrate provided by the embodiment of the present application. Different from the above embodiment, the array substrate 101 formed by the present embodiment is a top gate structure. After the active layer 30 and the protective layer 40 are formed synchronously on the underlay substrate 10, the array substrate manufacturing method further comprise a step as follows:

forming a second metal thin film on the protective layer 40 and the underlay substrate 10 and patterning the second metal thin film to form a source electrode 51 and a drain electrode 52, wherein the source electrode 51 and the drain electrode 52 are connected to the active layer 30 on two sides of the protective layer 40.

In particular, a depositing process such as a sputtering deposition process or a physical vapor deposition process is also used to deposit a second metal thin film on the protective layer 40 and the underlay substrate 10, then a yellow light process is performed to the second metal thin film to form the source electrode 51 on the corresponding source electrode region 32 of the active layer 30 and form the drain electrode 52 on the corresponding drain electrode region 33 of the active layer 30. The source electrode 51 is connected to the source electrode region 32, and, the drain electrode 52 is connected to the drain electrode region 33. Optionally, a material of the second metal thin film comprises at least one of molybdenum (Mo), aluminum (Al), or copper (Cu).

A gate electrode insulation layer 11 is formed on the source electrode 51, the drain electrode 52, and the protective layer 40.

In particular, one or more inorganic film layers are deposited on the source electrode 51, the drain electrode 52 and the protective layer 40 as a gate electrode insulation layer 11. Optionally, the inorganic film layer comprises a silicon nitride (SiNx) layer, a silicon oxide (SiOx) layer, or a lamination complex film of the silicon nitride (SiNx) layer and the silicon oxide (SiOx) layer.

A gate electrode 20 is formed on the gate electrode insulation layer 11, and the gate electrode 20 is disposed to correspond to the protective layer 40.

In particular, then a depositing process such as sputtering deposition process or physical vapor deposition process is used to deposit a first metal thin film on the gate electrode insulation layer 11, and then perform a yellow light process to the first metal thin film to form the gate electrode 20 at a location corresponding to the protective layer 40. Optionally, a material of the first metal thin film comprises at least one of molybdenum (Mo), aluminum (Al), or copper (Cu).

Of course, the array substrate manufacturing method of the present embodiment also comprises manufacturing a pixel electrode 60. In particular, a passivation layer 12 is formed on the gate electrode 20 and the gate electrode insulation layer 11, and the pixel electrode 60 is formed on the passivation layer 12. Other descriptions refer to the above embodiment and would not be described repeatedly here.

In an embodiment, the embodiment of the present application also provides an array substrate, the array substrate comprises the array substrate 100 manufactured by the array substrate manufacturing method of one of the aforementioned embodiments.

Based on the same invention concept, the embodiment of the present application also provides a display panel, the display panel comprises an opposite substrate and the array substrate 100 of the aforementioned embodiment. The array substrate 100 and the opposite substrate are disposed oppositely at an interval. the display panel comprises a liquid crystal display ((LCD) panel or a organic light emitting diode (OLED) display panel. When the display panel is a liquid crystal display panel, the opposite substrate is a color filter substrate, the display panel further comprises liquid crystal molecules disposed between the array substrate 100 and the opposite substrate. When the display panel is an organic light emitting diode display panel, the opposite substrate is an encapsulation substrate, the display panel further comprises light emitting devices disposed between the array substrate 100 and the opposite substrate.

According to the above the above embodiment:

The array substrate, the manufacturing method thereof, and the display panel thereof provided by the present application coat a first ink on an active region of an underlay substrate to form an active layer pattern, coating a second ink on a location of the active layer pattern corresponding to the channel region to form a protective layer pattern, curing the active layer pattern and the protective layer pattern to form films to make the active layer pattern form an active layer and make the protective layer pattern form protective layer such that the protective layer is disposed on the channel region of the active layer to protect the channel region of the active layer, which prevents the channel region of the active layer from corrosion and contamination to solve the corrosion and contamination of the conventional metal oxide. Also, the active layer and the protective layer are formed simultaneously to save one mask, which lowers the cost.

In the above-mentioned embodiments, the descriptions of the various embodiments are focused. For the details of the embodiments not described, reference may be made to the related descriptions of the other embodiments.

The embodiments of the present application are described in detail as above. The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. An array substrate, comprising: an underlay substrate, wherein an active region and a channel region are defined on the underlay substrate, and the channel region is located in the active region; an active layer disposed to correspond to the active region on the underlay substrate; and a protective layer located on a side of the active layer away from the underlay substrate and disposed to correspond to the channel region; wherein an active layer pattern forms the active layer, and a protective layer pattern forms the protective layer, the active layer pattern is formed by a first ink coated on the active region, and the protective layer pattern is formed by a second ink coated on the channel region; wherein a source electrode and a drain electrode partially cover the protective layer and connected to the active layer and coplanar to the active layer on two sides of the protective layer respectively; wherein the protective layer located above the active layer is located between the source electrode and the drain electrode, does not contact the underlay substrate, and has two ends covered by the source electrode and the drain electrode respectively, and an outer edge of the protective layer does not extend beyond an outer edge of the active layer.

2. The array substrate according to claim 1, wherein the active layer pattern is formed by manufacturing a metal salt solution to form the first ink and by an ink-jet printing process printing the first ink on the active region.

3. The array substrate according to claim 2, wherein the metal salt solution comprises at least one of a $Zn(NO_3)_2$ solution or an $In(NO_3)_3$ solution.

4. The array substrate according to claim 2, wherein the protective layer pattern is formed by dissolving $SiS_2$ powders in an organic solvent to form the second ink and by an ink-jet printing process printing the second ink on the channel region.

5. The array substrate according to claim 4, wherein the organic solvent comprises benzene and alcohols.

6. The array substrate according to claim 1, wherein the array substrate further comprises:
a gate electrode disposed on the underlay substrate;
a gate electrode insulation layer covering the gate electrode and the underlay substrate, wherein the active layer is located on the gate electrode insulation layer.

7. The array substrate according to claim 1, wherein the array substrate further comprises:
a gate electrode insulation layer covering the source electrode, the drain electrode, and the protective layer; and
a gate electrode disposed on the gate electrode insulation layer and disposed to correspond to the protective layer.

* * * * *